(12) United States Patent
Lee

(10) Patent No.: US 11,575,819 B2
(45) Date of Patent: Feb. 7, 2023

(54) IMAGE SENSOR

(71) Applicant: SK hynix Inc., Icheon-si (KR)

(72) Inventor: Jae Won Lee, Icheon-si (KR)

(73) Assignee: SK HYNIX INC.

( * ) Notice: Subject to any disclaimer, the term of this patent is extended or adjusted under 35 U.S.C. 154(b) by 197 days.

(21) Appl. No.: 16/993,074

(22) Filed: Aug. 13, 2020

(65) Prior Publication Data

US 2021/0250480 A1    Aug. 12, 2021

(30) Foreign Application Priority Data

Feb. 6, 2020    (KR) .................. 10-2020-0014361

(51) Int. Cl.
| | |
|---|---|
| *H04N 5/225* | (2006.01) |
| *H04N 9/04* | (2006.01) |
| *H01L 27/146* | (2006.01) |
| *G02B 3/00* | (2006.01) |
| *G02B 5/20* | (2006.01) |
| *G02B 1/115* | (2015.01) |

(52) U.S. Cl.
CPC ....... *H04N 5/2258* (2013.01); *H01L 27/1462* (2013.01); *H01L 27/14607* (2013.01); *H01L 27/14621* (2013.01); *H01L 27/14627* (2013.01); *H01L 27/14636* (2013.01); *H01L 27/14645* (2013.01); *H01L 27/14649* (2013.01); *H04N 5/2254* (2013.01); *H04N 9/045* (2013.01); *G02B 1/115* (2013.01); *G02B 3/0056* (2013.01); *G02B 5/208* (2013.01)

(58) Field of Classification Search
CPC ............ H04N 5/2258; H01L 27/14607; H01L 27/1462; H01L 27/1461; H01L 27/1427
USPC ........................................................ 348/164
See application file for complete search history.

(56) References Cited

U.S. PATENT DOCUMENTS

| | | | |
|---|---|---|---|
| 2011/0128423 A1* | 6/2011 | Lee .................. | H04N 5/332 348/294 |
| 2019/0019823 A1 | 1/2019 | Ooki et al. | |
| 2019/0088697 A1 | 3/2019 | Furukawa et al. | |

FOREIGN PATENT DOCUMENTS

KR    10-2014-0147376 A    12/2014

OTHER PUBLICATIONS

First Office Action for Chinese Patent Application No. 202010789829.X dated Jul. 26, 2022.

* cited by examiner

*Primary Examiner* — On S Mung
(74) *Attorney, Agent, or Firm* — Perkins Coie LLP

(57) ABSTRACT

An image sensor includes a color sensor chip configured to generate a color image by sensing visible light in incident light; a light transfer layer disposed under the color sensor chip, and including an infrared light pass filter which filters infrared light from light having passed through the color sensor chip; and a depth sensor chip disposed under the light transfer layer, and configured to generate a depth image by sensing the infrared light.

20 Claims, 4 Drawing Sheets

IMAGE SENSOR

CROSS-REFERENCES TO RELATED APPLICATION

This patent document claims priority and benefits of Korean Patent Application No. 10-2020-0014361, filed on Feb. 6, 2020 in the Korean Intellectual Property Office, which is incorporated herein by reference in its entirety as part of the disclosure of this patent document.

TECHNICAL FIELD

The technology and implementations disclosed in this patent document generally relate to an image sensor capable of obtaining a color image and a depth image together.

BACKGROUND

An image sensor is a device which captures an image by using the property of a semiconductor that reacts to light. With the recent development of the computer industry and communication industry, the demand for high-performance image sensing devices, for example, smartphones, digital cameras, game consoles, Internet of Things, robots, surveillance cameras, medical micro cameras, etc., has been increasing.

Image sensors may be generally classified into CCD (charge coupled device) image sensors and CMOS (complementary metal oxide semiconductor) image sensors. CCD image sensors have less noise and better image quality than CMOS image sensors. However, CMOS image sensors have a simpler and more convenient driving schemes, and thus may be preferred in some applications. Also, CMOS image sensors may integrate a signal processing circuit in a single chip, making it easy to miniaturize CMOS image sensors for implementation in a product, with the added benefits of consuming very low power. CMOS image sensors can be fabricated using CMOS fabrication technology, which results in low manufacturing costs. CMOS image sensing devices have been widely used due to their suitability for implementation in a mobile device.

Methods for measuring a depth by using an image sensor have been developed through many studies, and the demand increases in various fields including security, medical devices, automobiles, video game consoles, VR/AR and mobile devices. To measure a depth, various techniques including triangulation, time-of-flight and interferometry can be used. Among these methods, the time-of-flight method becomes popular because of its wide range of utilization, high processing speed and cost advantages.

When a depth sensor is additionally mounted to an electronic device to improve the security of the electronic device or the performance of functions of various applications, the addition of the depth sensor may require an extra space in the electronic device and may cause design limitations and cost increases.

SUMMARY

Various embodiments are directed to an image sensor having an optimized stack structure.

Various objects to be achieved by the disclosure are not limited to the aforementioned objects, and those skilled in the art to which the disclosure pertains may clearly understand other objects from the following descriptions.

In one aspect, an image sensor is provided to comprise: a color sensor chip configured to generate a color image by sensing visible light in incident light; a light transfer layer disposed under the color sensor chip, and including an infrared light pass filter which filters infrared light from light having passed through the color sensor chip; and a depth sensor chip disposed under the light transfer layer, and configured to generate a depth image by sensing the infrared light.

In another aspect, an image sensor may include: a color sensor chip configured to detect visible light in light incident to the color sensor chip and generate a color image; a light transfer layer disposed under the color sensor chip and configured to receive light having passed through the color sensor chip, the light transfer layer including an infrared light pass filter allowing infrared light of the received light to pass through the infrared light pass filter; and a depth sensor chip disposed under the light transfer layer, and configured to receive the infrared light from the light transfer layer and generate a depth image based on the infrared light In another aspect, an image sensor may include: a color sensor chip and a depth sensor chip that are stacked to vertically overlap with each other; and an infrared light pass filter disposed between a photoelectric conversion element of the color sensor chip and a photoelectric conversion element of the depth sensor chip, and configured to filter infrared light from light having passed through the color sensor chip.

In another aspect, An image sensor comprising: a color sensor chip and a depth sensor chip that are stacked to vertically overlap with each other, each of the color sensor chip and the depth sensor chip includes a photoelectric conversion element configured to generate photocharges in response to incident light received by the color sensor chip or the depth sensor chip; and an infrared light pass filter disposed between the photoelectric conversion element of the color sensor chip and the photoelectric conversion element of the depth sensor chip, and configured to allow infrared light to pass through the infrared light pass filter.

According to the embodiments disclosed in the present document, by disposing a color sensor chip for generating a color image and a depth sensor chip for generating a depth image, in a stack structure, the degree of integration may be improved.

Also, since infrared light having passed through the color sensor chip may be effectively transferred to the depth sensor chip, it is possible to prevent the performance of the depth sensor chip from being degraded.

Besides, a variety of effects directly or indirectly understood through the present document may be provided.

DETAILED DESCRIPTION

Hereinafter, various embodiments of the disclosed technology will be disclosed with reference to the accompanying drawings. However, the description is not intended to limit the disclosed technology to particular embodiments, and it should be construed as including various modifications, equivalents, and/or alternatives according to the embodiments of the disclosed technology.

Figure 1:
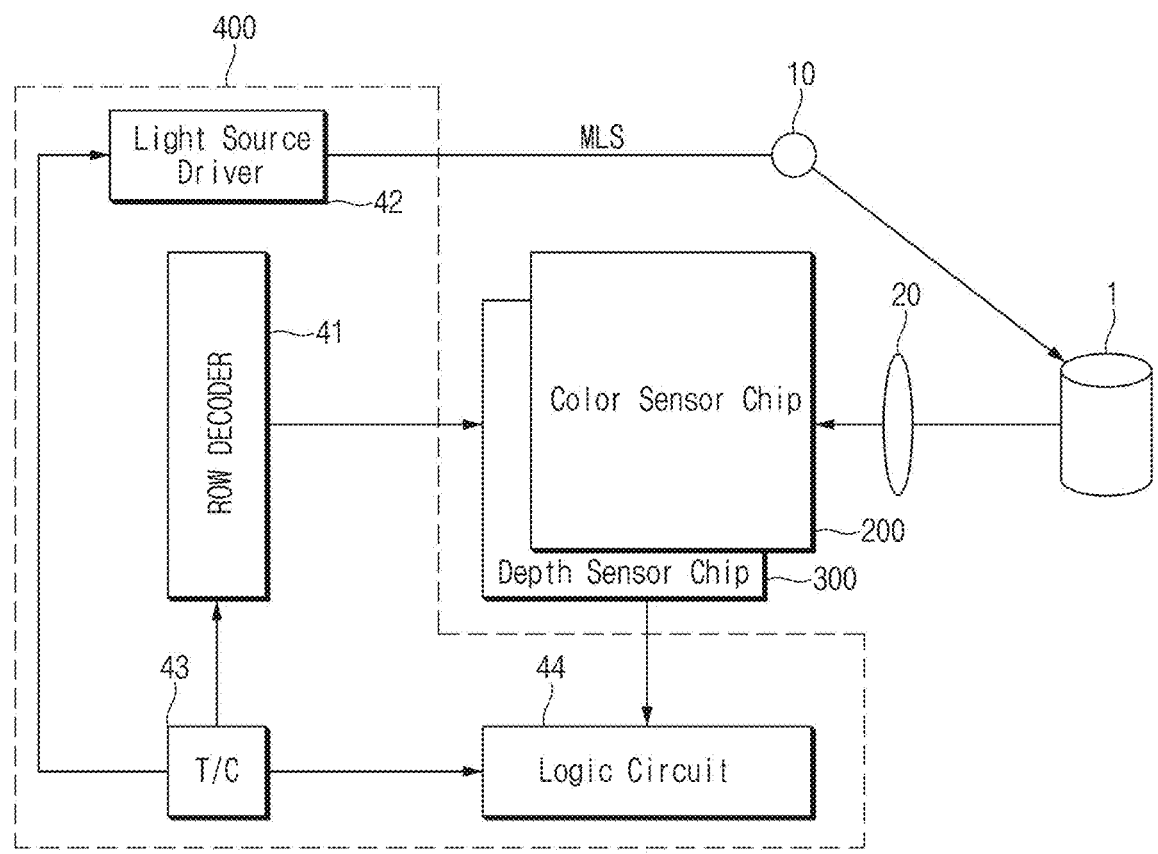
FIG. 1 is a diagram schematically illustrating a representation of an example of a configuration of an image sensor in accordance with embodiments of the disclosed technology.

FIG. 1 is a diagram schematically illustrating a representation of an example of the configuration of an image sensor in accordance with embodiments of the disclosed technology.

Referring to FIG. 1, the image sensor as a CMOS image sensor may obtain together a color image corresponding to a specific color (e.g., R (red), G (green) or B (blue)) and a depth image for measuring a distance to a target object 1 by using a time-of-flight (TOF) method. The image sensor may include a light source 10, a lens module 20, a color sensor chip 200, a depth sensor chip 300, and a logic chip 400.

The light source 10 emits light to the target object 1 in response to a clock signal MLS (modulated light signal) from the logic chip 400. The light source 10 may be a laser diode (LD), a light emitting diode (LED), a near infrared laser (NIR), a point light source, a monochromatic illumination source in which a white lamp and a monochromator are combined, or a combination of other laser light sources, which emits light within a specific wavelength band (for example, near infrared, infrared or visible light). For example, the light source 10 may emit infrared having a wavelength of 800 nm to 1000 nm. Light emitted from the light source 10 may be modulated light modulated to a predetermined frequency. While FIG. 1 illustrates only one light source 10 for the sake of convenience in explanation, it is to be noted that a plurality of light sources may be arranged around the lens module 20.

The lens module 20 may collect light incident from the target object 1, and may transfer the collected light to the sensor chips 200 and 300. Light incident from the target object 1 may include infrared which is emitted from the light source 10 and is reflected by the target object 1 and visible ray which is irradiated from an external light source (e.g., sunlight or lighting) and is reflected by the target object 1. In some implementations, the target object 1 may mean one object. In some implementations, the target object 1 may mean a scene which transfers light incident on the lens module 20. For example, the lens module 20 may include a focusing lens or another cylindrical optical element having a glass or plastic surface. The lens module 20 may include a plurality of lenses which are aligned around an optical axis.

The color sensor chip 200 may include a plurality of color pixels which are successively arranged in a two-dimensional matrix structure (for example, are successively arranged in a column direction and a row direction). The color pixels may be supported by or formed in a semiconductor substrate. Each color pixel may convert light corresponding to a specific color in light incident through the lens module 20 into an electrical signal corresponding to the intensity of the light, and thereby, may output a color pixel signal. Accordingly, the color pixel signals from the color pixels of the color sensor chip 200 can be used to represent a color pattern or image in the incident light received by the color sensor chip 200.

The depth sensor chip 300 may include a plurality of depth pixels which are successively arranged in a two-dimensional matrix structure in which the depth pixels are arranged in columns and rows. The depth pixels may be supported by or formed in a semiconductor substrate. Each depth pixel may convert light corresponding to infrared in light incident through the lens module 20 into an electrical signal corresponding to the intensity of the light, and thereby, may output a depth pixel signal.

Each of the color pixels and the depth pixels may include a photoelectric conversion element, e.g., a photodiode, a photo transistor, a photo gate, or other photosensitive circuitry, which generates and accumulates photocharges corresponding to intensity of incident light, and at least one transistor which processes the photocharges to generate an electrical signal. For example, each of the color pixels and the depth pixels may have a 3TR (transistor), 4TR or 5TR structure.

A resolution of an array configured by the color pixels and a resolution of an array configured by the depth pixels may be the same as or different from each other. For example, the resolution of the array configured by the depth pixels may be smaller than the resolution of the array configured by the color pixels.

The logic chip 400 may irradiate light to the target object 1 by controlling the light source 10. The logic chip 400 may drive the color pixels of the color sensor chip 200 and the depth pixels of the depth sensor chip 300 to process a color pixel signal and a depth pixel signal corresponding to light reflected from the target object 1 and generate a color image and a depth image for the target object 1. The color image may be an image representing a color of the target object 1, and the depth image may be an image representing a distance to the target object 1.

The logic chip 400 may include a row decoder 41, a light source driver 42, a timing controller 43, and a logic circuit 44.

The row decoder 41 may drive the color pixels of the color sensor chip 200 and the depth pixels of the depth sensor chip 300 in response to a timing signal outputted from the timing controller 43. For example, the row decoder 41 may generate a control signal capable of selecting and controlling at least one row line among a plurality of row lines of each of the color sensor chip 200 and the depth sensor chip 300. Such a control signal may include a reset signal which controls a reset transistor, a transfer signal which controls a transfer transistor, and a select signal which controls a select transistor.

The light source driver 42 may generate the clock signal MLS capable of driving the light source 10 under the control of the timing controller 43. The clock signal MLS may be a signal which is modulated to a predetermined frequency.

The timing controller 43 may generate the timing signal for controlling operations of the row decoder 41, the light source driver 42 and the logic circuit 44.

The logic circuit 44 may generate digital signal type pixel data by processing pixel signals outputted from the color sensor chip 200 and the depth sensor chip 300 under the control of the timing controller 43. To this end, the logic circuit 44 may include a correlated double sampler (CDS) for performing correlated double sampling on the pixel signals outputted from the color sensor chip 200 and the depth sensor chip 300. Also, the logic circuit 44 may include an analog-digital converter for converting output signals from the correlated double sampler into digital signals. Further, the logic circuit 44 may include a buffer circuit for temporarily storing pixel data outputted from the analog-digital converter and outputting the pixel data to the outside under the control of the timing controller 43.

In some implementations, the logic circuit 44 may generate a color image sensed by the color sensor chip 200 and a depth image sensed by the depth sensor chip 300, and an image signal processor (not illustrated) provided independently of the logic circuit 44 or the image sensor may synthesize the color image and the depth image to generate a 3D image or calculate a distance to the target object 1 from the depth image.

In detail, the light source 10 may emit modulated light which is modulated to a predetermined frequency, toward a scene to be photographed or captured by the image sensor, and the image sensor may generate a depth image of the depth pixels by sensing modulated light (that is, incident light) reflected from the target object 1 in a scene. There is a time delay between the modulated light and the incident light depending on a distance between the image sensor and the target object 1. Such a time delay is represented as a phase difference between a signal which is generated by the image sensor and the clock signal MLS which controls the light source 10. An image processor (not illustrated) may calculate depth information on each depth pixel by calculating a phase difference represented on a depth image outputted from the image sensor.

Figure 2:
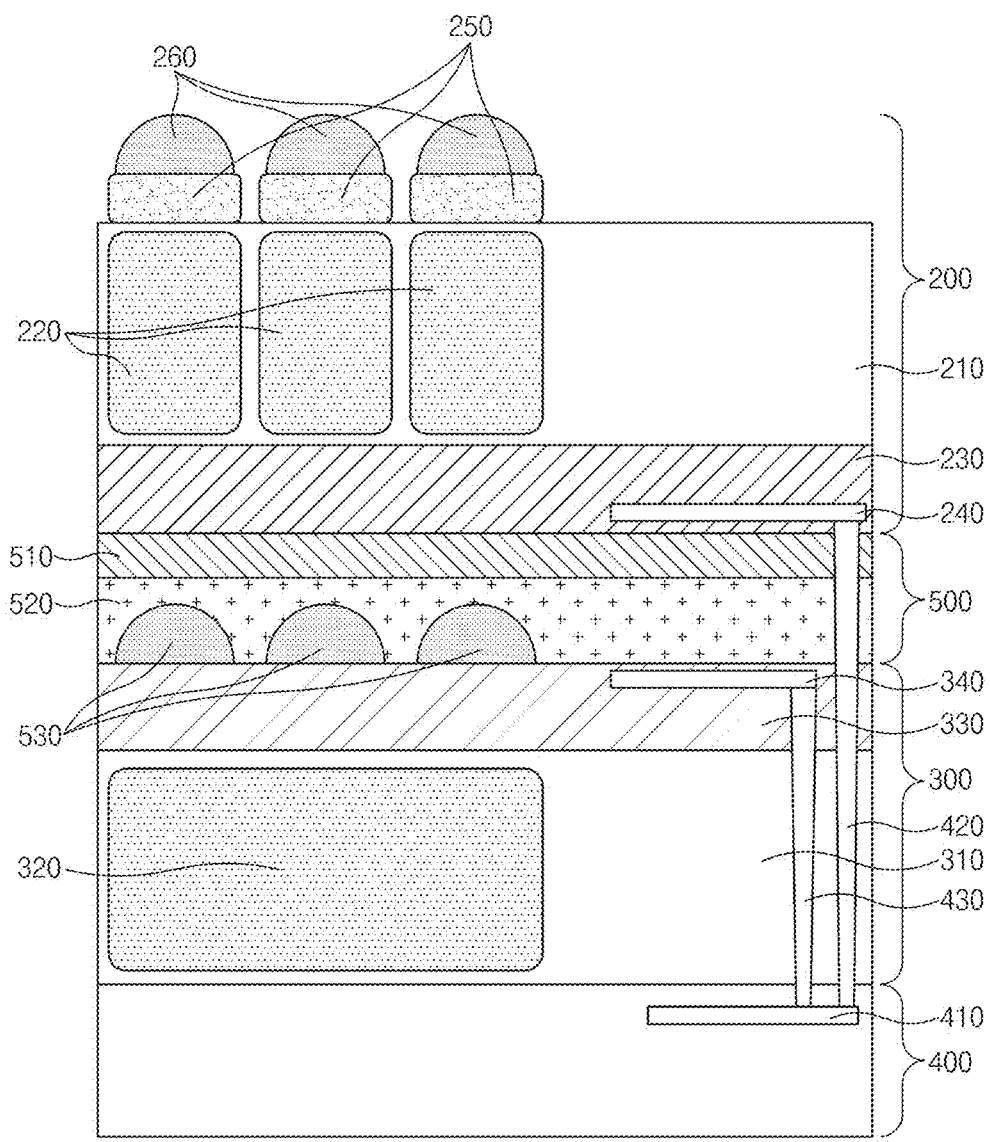
FIG. 2 is a cross-sectional view illustrating a representation of an example of a stack structure of the image sensor of FIG. 1.

FIG. 2 is a cross-sectional view illustrating a representation of an example of a stack structure of the image sensor of FIG. 1.

Referring to FIG. 2, there is illustrated an example of a stack structure of the color sensor chip 200, the depth sensor chip 300 and the logic chip 400 that are included in the image sensor.

The color sensor chip 200, the depth sensor chip 300 and the logic chip 400 are sequentially stacked from the top of FIG. 2, and a light transfer layer 500 may be additionally disposed between the color sensor chip 200 and the depth sensor chip 300.

The color sensor chip 200 may include a substrate 210, photoelectric conversion elements 220, a wiring layer 230, a through-silicon via (TSV) pad 240, color filters 250, and microlenses 260.

The substrate 210 may include a top surface and a bottom surface which face away from each other and opposite to each other. For example, the substrate 210 may be a P type or N type bulk substrate, a substrate in which a P type or N type epitaxial layer is grown in a P type bulk substrate, or a substrate in which a P type or N type epitaxial layer is grown in an N type bulk substrate.

The photoelectric conversion elements 220 may be disposed in regions corresponding to the respective color pixels in the substrate 210. The photoelectric conversion elements 220 may generate and accumulate photocharges corresponding to the intensity of light within a specific visible light wavelength band. The photoelectric conversion elements 220 may be formed to occupy an area as large as possible in order to increase a fill factor representing light receiving efficiency. For example, each photoelectric conversion element 220 may be realized by a photodiode, a phototransistor, a photogate, a pinned photodiode or a combination thereof.

When each photoelectric conversion element 220 is realized by, for example, a photodiode, each photoelectric conversion element 220 may be formed as an N type doped region through an ion implantation process of implanting N type ions. According to an embodiment, a photodiode may be formed in a form in which a plurality of doped regions are stacked. In this case, an underlying doped region may be formed by implanting P type ions and N+ type ions, and an overlying doped region may be formed by implanting N-type ions.

While only three color pixels are illustrated in FIG. 2 for the sake of convenience in explanation, a plurality of color pixels which are arranged in the form of an M×N (M and N are integers equal to or greater than 2) matrix may be included in the color sensor chip 200.

The wiring layer 230 may include pixel gates (not illustrated) and metal wirings (not illustrated).

Each of the pixel gates may operate according to a control signal to generate a color pixel signal, such that each color pixel may generate the color pixel signal corresponding to the photocharges generated and accumulated by each photoelectric conversion element 220. For example, the pixel gates may include a reset gate which configures the reset transistor, a transfer gate which configures the transfer transistor, and a select gate which configures the select transistor. Each of the pixel gates may include a gate dielectric layer for electrical isolation from the substrate 210 and a gate electrode which receives a control signal.

The metal wirings included in the wiring layer may transfer control signals to the pixel gates from the TSV pad 240. With the control signals transferred from the TSV pad 240, the pixel gates included in the wiring layer may transfer, to the TSV pad 240, color pixel signals that are generated by the operations of the pixel gates. The metal wirings may be disposed in a multilayered structure which includes a plurality of layers, and may be electrically isolated by an interlayer dielectric layer. In addition, in order that light within an infrared wavelength band transmitted through the substrate 210 may be effectively incident on the underlying light transfer layer 500, metal wirings may not be disposed as possible in regions corresponding to the bottoms of the photoelectric conversion elements 220.

The TSV pad 240 may be disposed at the same level as a lowermost layer of the metal wirings, and may be electrically coupled with the metal wirings and a first TSV 420 to transfer an electrical signal (for example, a control signal and a color pixel signal). The TSV pad 240 may have a wider horizontal area than the first TSV 420. The TSV pad 240 may be disposed in a peripheral region where the color pixels are not disposed.

Each color filter 250 may be formed on the top of the substrate 210, and may selectively transmit light within a specific wavelength band (for example, red, green or blue) of a visible light wavelength band. Each color filter 250 may not include an infrared cut filter, and due to this fact, light transmitted through the color filter 250 may include light within the specific visible light wavelength band corresponding to the color filter 250 and light within the infrared wavelength band. Light within the infrared wavelength band (hereinafter, referred to as 'infrared light') has a longer wavelength than light within the visible light wavelength band (hereinafter, referred to as 'visible light'). Silicon and some semiconductor materials are known to absorb light at different wavelengths at different levels. In general, the light penetration depths in silicon increase with the wavelength of light. Specifically, the penetration depths of light in the infrared spectral range of 800 nm and longer wavelengths are larger than those of the visible light in the spectral range from 400 nm to 700 nm. Therefore, the image sensor can be designed based on the above different penetration depths of infrared light and visible light in mind so that most of visible light having passed through the color filter 250 may be absorbed by the photoelectric conversion element 220, but most of infrared light having passed through the color filter 250 may not be fully absorbed by the photoelectric conversion element 220 to pass through the photoelectric conversion element 220 to reach the wiring layer 230. Accordingly, another layer of light sensors located below the light sensors by the photoelectric conversion elements 210 may be implemented to detect the infrared light as a depth sensor while the light sensors by the photoelectric conversion elements 210 are used as an imaging sensor for sensing visible light to produce color images.

Each microlens 260 may be formed in a hemispherical shape on the top of the color filter 250, and may increase light gathering power for incident light to improve light receiving efficiency. An overcoating layer (not illustrated) capable of preventing scattered reflection of light incident from the outside and thereby suppressing a flare characteristic may be additionally formed on or under the microlenses 260.

The light transfer layer 500 may be disposed between the color sensor chip 200 and the depth sensor chip 300. Light transmitted through the color sensor chip 200 is may be incident on the light transfer layer 500 and the light transfer layer 500 may effectively transfer infrared light of light to the depth sensor chip 300. The light transfer layer 500 may include an infrared light pass filter 510, an antireflection layer 520, and infrared light microlenses 530. While FIG. 2 illustrates that the infrared light pass filter 510, the antireflection layer 520 and the infrared light microlenses 530 are sequentially stacked from the top, the stack order of the infrared light pass filter 510, the antireflection layer 520 and the infrared light microlenses 530 may be changed.

The infrared light pass filter 510 may be a band pass filter which passes only light within a specific infrared wavelength band (e.g., 840 to 950 nm). The infrared light pass filter 510 may pass only light within the specific infrared wavelength band in light transmitted through the color sensor chip 200, and may remove (absorb or reflect) the remaining light components. In light transmitted through the color sensor chip 200, visible light having passed through the overlying color filter 250, which is not entirely absorbed by the photoelectric conversion element 220, may be partially included. Since such visible light may act as noise with respect to the underlying depth sensor chip 300, the infrared light pass filter 510 may block light within the visible light wavelength band. For example, the infrared light pass filter 510 may be realized by a mirror glass or a multilayered thin film, but the scope of the disclosed technology is not limited thereto.

The antireflection layer 520 may be disposed under the infrared light pass filter 510, and may compensate for a difference in refractive index between the infrared light pass filter 510 and the infrared light microlenses 530 such that infrared light having passed through the infrared light pass filter 510 may be incident into the infrared light microlenses 530. To this end, a refractive index of the antireflection layer 520 may be smaller than a refractive index (e.g., 2.0 to 2.7) of the infrared light pass filter 510 and may be larger than a refractive index (e.g., 1.4 to 1.6) of the infrared light microlenses 530. The antireflection layer 520 may be made of or include silicon oxide whose refractive index can be adjusted.

In some implementations, the antireflection layer 520 may have a multilayered structure including a plurality of layers, and refractive indexes of the plurality of layers may sequentially or gradually decrease toward the infrared light microlenses 530 from the infrared light pass filter 510 (i.e., from top to bottom). Assuming that infrared light is vertically incident on the antireflection layer 520, a reflectance at an interlayer boundary is proportional to the square of a difference in refractive index between two layers forming the interlayer boundary according to the Fresnel equation. As the antireflection layer 520 includes the plurality of layers whose refractive indexes gradually decrease downward, a difference in refractive index at each interlayer boundary may be minimized to prevent reflection of infrared light. The number of layers included in the antireflection layer 520 and a difference in refractive index between adjacent layers may be experimentally determined to minimize reflection of infrared light.

The antireflection layer 520 may be formed in the shape of a flat plate which covers the tops of the infrared light microlenses 530 each having a predetermined curvature, thereby providing good flatness thereon.

The infrared light microlenses 530 may be formed in hemispherical shapes under the antireflection layer 520, and may improve the light receiving efficiency of a photoelectric conversion element 320 of the depth sensor chip 300 by increasing light gathering power for infrared light. The infrared light microlenses 530 may be disposed to correspond to the photoelectric conversion elements 220 of the color sensor chip 200, respectively. Thus, one-to-one correspondence is made between each of the infrared light microlenses 530 and each of the photoelectric conversion elements 220. The infrared light microlenses 530 may vertically overlap with the photoelectric conversion elements 220. As illustrated in FIG. 2, a plurality of (e.g., three) infrared light microlenses 530 may correspond to one photoelectric conversion element 320. In this case, while a resolution of each of the depth pixels included in the depth sensor chip 300 may be reduced to a predetermined ratio (e.g., 1/3) compared to a resolution of each of the color pixels included in the color sensor chip 200, sensitivity can be improved through the photoelectric conversion element 320 having a larger volume, in view of the facts that an absorption rate of infrared light is lower than an absorption rate of visible light and infrared light decreases in the intensity thereof while passing through the color sensor chip 200.

In some implementations, the infrared light microlenses 530 may include at least one among a polymeric material such as a polystyrene-based resin, a polyimide-based resin, a polysiloxane-based resin, an acryl-based resin, an epoxy-based resin and a copolymer resin thereof, a silicon oxide-based inorganic material or a silicon nitride-based inorganic material.

The depth sensor chip 300 may include a substrate 310, the photoelectric conversion element 320, a wiring layer 330, and a TSV pad 340.

The substrate 310 may include a top surface and a bottom surface which face away from each other and opposite to each other. For example, the substrate 310 may be a P type or N type bulk substrate, a substrate in which a P type or N type epitaxial layer is grown in a P type bulk substrate, or a substrate in which a P type or N type epitaxial layer is grown in an N type bulk substrate.

The photoelectric conversion element 320 may be disposed in a region corresponding to each depth pixel in the substrate 310. The photoelectric conversion element 320 may generate and accumulate photocharges corresponding to the intensity of infrared light received by the photoelectric conversion element. The photoelectric conversion element 320 may be formed to occupy an area as large as possible in order to increase a fill factor representing light receiving efficiency. For example, the photoelectric conversion element 320 may be realized by a photodiode, a phototransistor, a photogate, a pinned photodiode or a combination thereof.

When the photoelectric conversion element 320 is realized by, for example, a photodiode, the photoelectric conversion element 320 may be formed as an N type doped region through an ion implantation process of implanting N type ions. According to an embodiment, a photodiode may be formed in a form in which a plurality of doped regions are stacked. In this case, an underlying doped region may be formed by implanting P type ions and N+ type ions, and an overlying doped region may be formed by implanting N-type ions.

While only one depth pixel is illustrated in FIG. 2 for the sake of convenience in explanation, a plurality of depth pixels which are arranged in the form of a K×L (K and L are integers equal to or greater than 2) matrix may be included in the depth sensor chip 300.

The wiring layer 330 may include pixel gates (not illustrated) and metal wirings (not illustrated).

Each of the pixel gates may operate according to a control signal to generate a depth pixel signal, such that each depth pixel may generate the depth pixel signal corresponding to the photocharges accumulated by the photoelectric conversion element 320. For example, the pixel gates may include a reset gate which configures the reset transistor, a transfer gate which configures the transfer transistor, and a select gate which configures the select transistor. Each of the pixel gates may include a gate dielectric layer for electrical isolation from the substrate 310 and a gate electrode which receives a control signal.

The metal wirings included in the wiring layer may transfer control signals to the pixel gates from the TSV pad 340. With the control signals transferred from the TSV pad 340, the pixel gates included in the wiring layer may transfer, to the TSV pad 340, depth pixel signals that are generated by the operations of the pixel gates. The metal wirings may be disposed in a multilayered structure which includes a plurality of layers, and may be electrically isolated by an interlayer dielectric layer. In addition, in order that infrared light transmitted through the light transfer layer 500 may be effectively incident on the underlying substrate 310, metal wirings may not be disposed as possible in a region corresponding to the top of the photoelectric conversion element 320.

The TSV pad 340 may be disposed at the same level as an uppermost layer of the metal wirings, and may be electrically coupled with the metal wirings and a second TSV 430 to transfer an electrical signal (for example, a control signal and a depth pixel signal). The TSV pad 340 may have a wider horizontal area than the second TSV 430. The TSV pad 340 may be disposed in a peripheral region where the depth pixels are not disposed.

The logic chip 400 may perform a series of operations for generating a color image and a depth image as described above with reference to FIG. 1. The logic chip 400 may include a TSV pad 410.

The TSV pad 410 may be electrically coupled with the first and second TSVs 420 and 430 and logic circuits in the logic chip 400 to transfer electrical signals (e.g., a control signal and a color pixel signal). The TSV pad 410 may have a wider horizontal area than the first and second TSVs 420 and 430. The TSV pad 410 may be disposed to at least partially overlap, in the vertical direction, with the TSV pad 240 of the color sensor chip 200 and the TSV pad 340 of the depth sensor chip 300.

The TSV pads 240, 340 and 410 and the metal wirings may include silver (Ag), copper (Cu), aluminum (Al), or others having high electrical conductivity. The TSV pads 240 and 410 may be electrically coupled through the first TSV 420, and the TSV pads 340 and 410 may be electrically coupled through the second TSV 430.

The first TSV 420 may be electrically coupled with the TSV pads 240 and 410 by vertically passing through the color sensor chip 200, the light transfer layer 500, the depth sensor chip 300 and the logic chip 400.

The second TSV 430 may be electrically coupled with the TSV pads 340 and 410 by vertically passing through the depth sensor chip 300 and the logic chip 400.

Each of the first TSV 420 and the second TSV 430 may have a dual structure including an inner plug for electrical coupling and a barrier surrounding the inner plug for electrical insulation of the inner plug, but the scope of the disclosed technology is not limited thereto. The inner plug may include silver (Ag), copper (Cu), aluminum (Al), or the like having high electrical conductivity. The barrier may include at least one among titanium (Ti), titanium nitride (TiN), tantalum (Ta), tantalum nitride (TaN) or other barrier metals.

Figure 3:
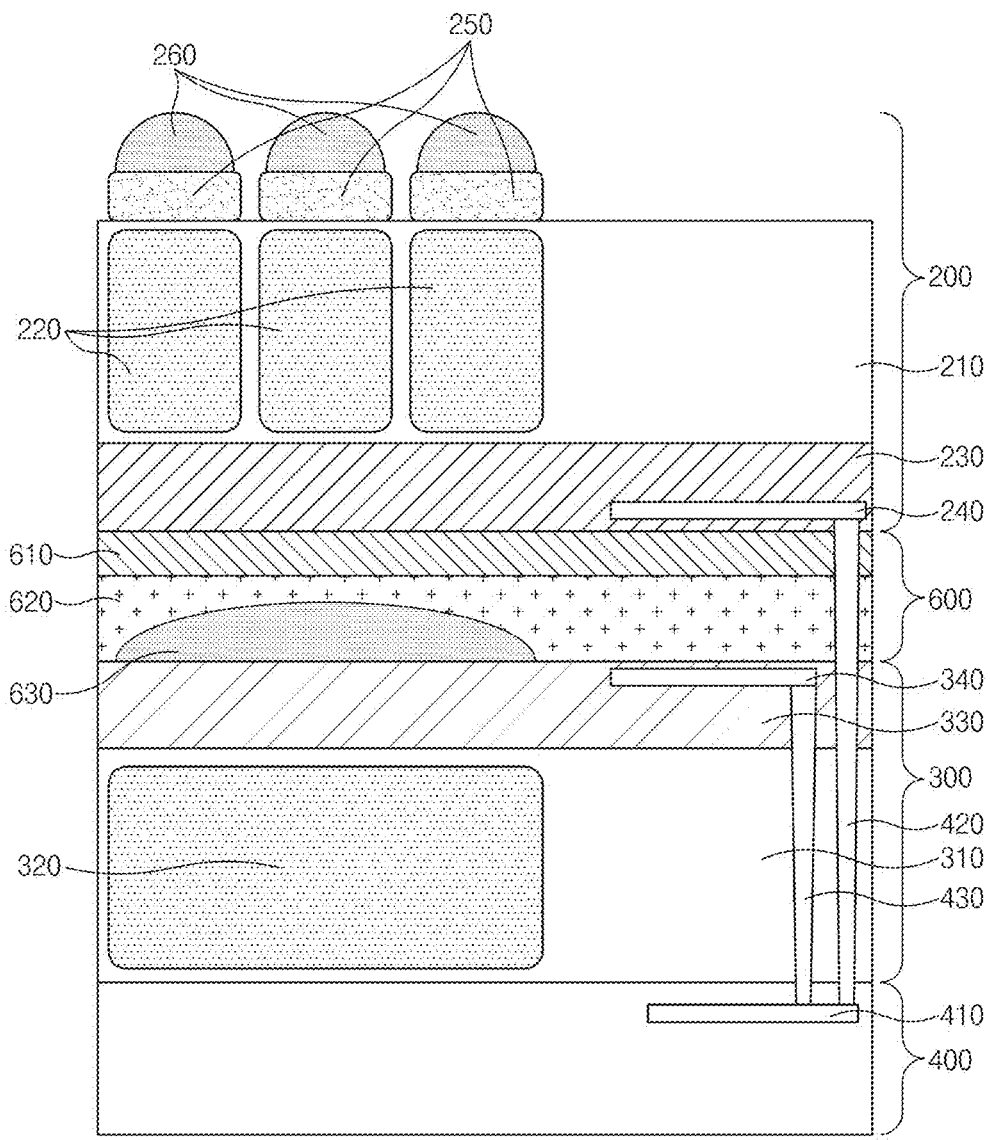
FIG. 3 is a cross-sectional view illustrating a representation of another example of a stack structure of the image sensor of FIG. 1.

FIG. 3 is a cross-sectional view illustrating a representation of another example of the stack structure of the image sensor of FIG. 1.

Referring to FIG. 3, there is illustrated another example of a stack structure of a color sensor chip 200, a depth sensor chip 300 and a logic chip 400 that are included in the image sensor.

The color sensor chip 200, the depth sensor chip 300 and the logic chip 400 are sequentially stacked from the top of FIG. 3, and a light transfer layer 600 may be additionally disposed between the color sensor chip 200 and the depth sensor chip 300.

Since the configuration of the image sensor illustrated in FIG. 3 and the configuration of the image sensor illustrated in FIG. 2 are substantially the same except for differences to be described below, descriptions will be made mainly for the differences in order to avoid duplicated description.

The light transfer layer 600 may include an infrared light pass filter 610, an antireflection layer 620, and an infrared light microlens 630. The infrared light pass filter 610 and the antireflection layer 620 may be substantially the same in structure and function as the infrared light pass filter 510 and the antireflection layer 520 described above with reference to FIG. 2.

Unlike FIG. 2, one infrared light microlens 630 may correspond to one photoelectric conversion element 320. In the same manner as in FIG. 2, the photoelectric conversion element 320 has a larger volume than the photoelectric conversion element 220 in order to improve sensitivity to infrared light, and may correspond to the infrared light microlens 630, respectively, using one-to-one correspondence. In this case, infrared light incident on the infrared light microlens 630 may be concentrated on the central region of the photoelectric conversion element 320.

Figure 4:
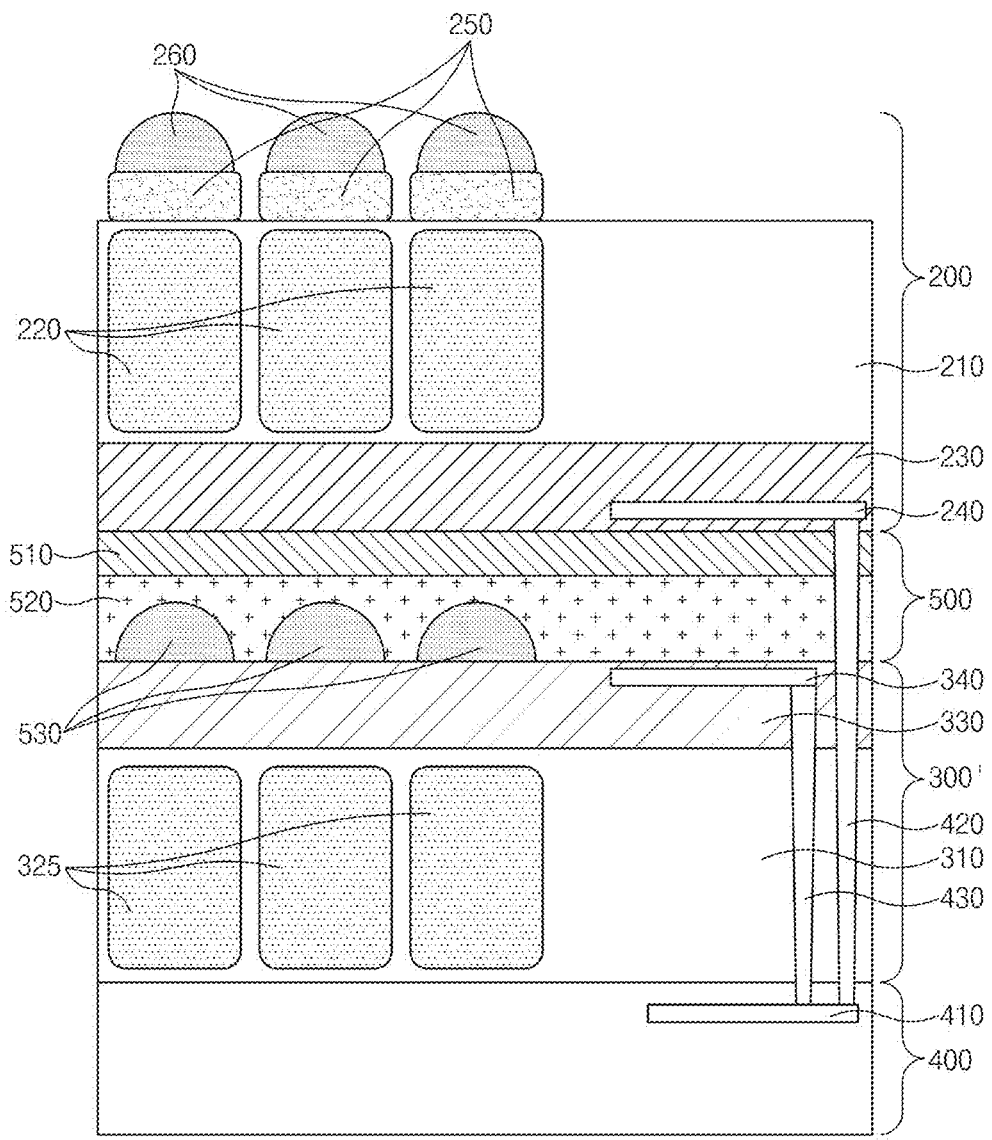
FIG. 4 is a cross-sectional view illustrating a representation of still another example of a stack structure of the image sensor of FIG. 1.

FIG. 4 is a cross-sectional view illustrating a representation of still another example of a stack structure of the image sensor of FIG. 1.

Referring to FIG. 4, there is illustrated still another example of a stack structure of the color sensor chip 200, the depth sensor chip 300 and the logic chip 400 that are included in the image sensor.

The color sensor chip 200, a depth sensor chip 300' and the logic chip 400 are sequentially stacked from the top of FIG. 4, and a light transfer layer 500 may be additionally disposed between the color sensor chip 200 and the depth sensor chip 300'.

Since the configuration of the image sensor illustrated in FIG. 4 and the configuration of the image sensor illustrated in FIG. 2 are substantially the same except for differences to be described below, descriptions will be made mainly for the differences in order to avoid duplicated description.

The depth sensor chip 300' may include a substrate 310, photoelectric conversion elements 325, a wiring layer 330, and a TSV pad 340. The substrate 310, the wiring layer 330 and the TSV pad 340 may be substantially the same in structure and function as the substrate 310, the wiring layer 330 and the TSV pad 340 that are described above with reference to FIG. 2.

As illustrated in FIG. 4, each of the infrared light microlenses 530 may correspond to each of the photoelectric conversion elements 325. In this case, a resolution of each of the depth pixels included in the depth sensor chip 300' may be the same as a resolution of each of the color pixels included in the color sensor chip 200. In the case of FIG. 4, the depth sensor chip 300' may generate a depth image having a higher resolution, but the sensitivity of the depth sensor chip 300' may be reduced as infrared light passes through the color sensor chip 200 and is weakened in its intensity. However, since each infrared light microlens 530 is disposed to correspond to each photoelectric conversion element 325, more infrared light can be collected and the low sensitivity can be compensated.

As is apparent from the above descriptions, in the image sensor according to the embodiments of the disclosed technology, by providing a stack structure including a color sensor chip for generating a color image and a depth sensor chip for generating a depth image, the degree of integration can be improved.

Also, since infrared light having passed through the color sensor chip may be effectively transferred to the depth sensor chip, it is possible to prevent the performance of the depth sensor chip from being degraded.

According to various embodiments, each component (e.g., a module or program) of the components described above may include a single entity or a plurality of entities. According to various embodiments, one or more of the above-described components or operations may be omitted, or one or more other components or operations may be added. Alternatively or additionally, a plurality of components (e.g., modules or programs) may be integrated into one component. In such a case, the integrated component may perform one or more functions of each of the plurality of components in a manner the same as or similar to that performed by the corresponding component of the plurality of components prior to the integration. In accordance with various embodiments, operations performed by a module, program, or other component may be performed sequentially, in parallel, repetitively or heuristically, or one or more of the operations may be performed in a different order or omitted, or one or more other operations may be added.

Only a few examples of specific implementations of the disclosed technology are described. Other implementations and variations may be made based on what is disclosed.

What is claimed is:

1. An image sensor comprising:
    a color sensor chip configured to detect visible light in light incident to the color sensor chip and generate a color image;
    a light transfer layer disposed under the color sensor chip and configured to receive light having passed through the color sensor chip, the light transfer layer including an infrared light pass filter allowing infrared light of the received light to pass through the infrared light pass filter; and
    a depth sensor chip disposed under the light transfer layer, and configured to receive the infrared light from the light transfer layer and generate a depth image based on the infrared light.

2. The image sensor according to claim 1, wherein the light transfer layer further includes an infrared light microlens configured to collect the infrared light.

3. The image sensor according to claim 2, wherein the light transfer layer further includes an antireflection layer which is disposed between the infrared light pass filter and the infrared light microlens.

4. The image sensor according to claim 3, wherein a refractive index of the antireflection layer is smaller than a refractive index of the infrared light pass filter and is larger than a refractive index of the infrared light microlens.

5. The image sensor according to claim 3, wherein the antireflection layer includes a plurality of layers whose refractive indexes decrease toward the infrared light microlenses from the infrared light pass filter.

6. The image sensor according to claim 2, wherein the infrared light microlens is disposed to correspond to a photoelectric conversion element of the color sensor chip.

7. The image sensor according to claim 6, wherein the infrared light microlens is disposed to correspond to a portion of a photoelectric conversion element of the depth sensor chip.

8. The image sensor according to claim 6, wherein the infrared light microlens is disposed to correspond to a photoelectric conversion element of the depth sensor chip.

9. The image sensor according to claim 2, wherein the infrared light microlens is disposed to correspond to a plurality of photoelectric conversion elements of the color sensor chip.

10. The image sensor according to claim 9, wherein the infrared light microlens is disposed to correspond to a photoelectric conversion element of the depth sensor chip.

11. An image sensor comprising:
    a color sensor chip and a depth sensor chip that are stacked to vertically overlap with each other, each of the color sensor chip and the depth sensor chip includes a photoelectric conversion element configured to generate photocharges in response to incident light received by the color sensor chip or the depth sensor chip; and
    an infrared light pass filter disposed between the photoelectric conversion element of the color sensor chip and the photoelectric conversion element of the depth sensor chip, and configured to allow infrared light included in light having passed through the color sensor chip to pass through the infrared light pass filter.

12. The image sensor according to claim 11, further comprising:
    an infrared light microlens configured to collect the infrared light.

13. The image sensor according to claim 12, further comprising:
    an antireflection layer disposed between the infrared light pass filter and the infrared light microlens.

14. The image sensor according to claim 13, wherein a refractive index of the antireflection layer is smaller than a refractive index of the infrared light pass filter and is larger than a refractive index of the infrared light microlens.

15. The image sensor according to claim 13, wherein the antireflection layer includes a plurality of layers whose refractive indexes decrease toward the infrared light microlenses from the infrared light pass filter.

16. The image sensor according to claim 11, further comprising a first wiring layer disposed between the color sensor chip and the infrared light pass filter.

17. The image sensor according to claim 11, further comprising a second wiring layer disposed between the infrared light pass filter and the depth sensor chip.

18. The image sensor according to claim 11, wherein the photoelectric conversion element of at least one of the color sensor chip and the depth sensor chip includes a photodiode, a phototransistor, a photogate, a pinned photodiode or a combination thereof.

19. The image sensor according to claim 11, wherein the photoelectric conversion element of the depth sensor chip has a larger volume than that of the photoelectric conversion element of the color sensor chip.

20. The image sensor according to claim 11, wherein the infrared light pass filter configured to allow the infrared light having wavelength in a range between 840 to 950 nm.

* * * * *